US011183611B2

(12) United States Patent
Gunawan et al.

(10) Patent No.: US 11,183,611 B2
(45) Date of Patent: *Nov. 23, 2021

(54) SUBSTRATE-FREE THIN-FILM FLEXIBLE PHOTOVOLTAIC DEVICE AND FABRICATION METHOD

(71) Applicants: INTERNATIONAL BUSINESS MACHINES CORPORATION, Armonk, NY (US); Solar Frontier K.K., Tokyo (JP)

(72) Inventors: Oki Gunawan, Westwood, NJ (US); Homare Hiroi, Tokyo (JP); Jeehwan Kim, Los Angeles, CA (US); David B. Mitzi, Mahopac, NY (US); Hiroki Sugimoto, Tokyo (JP)

(73) Assignees: INTERNATIONAL BUSINESS MACHINES CORPORATION, Armonk, NY (US); SOLAR FRONTIER K.K., Tokyo (JP)

( * ) Notice: Subject to any disclaimer, the term of this patent is extended or adjusted under 35 U.S.C. 154(b) by 86 days.

This patent is subject to a terminal disclaimer.

(21) Appl. No.: 16/702,025

(22) Filed: Dec. 3, 2019

(65) Prior Publication Data

US 2020/0105964 A1 Apr. 2, 2020

Related U.S. Application Data

(60) Continuation of application No. 15/671,573, filed on Aug. 8, 2017, now Pat. No. 10,580,928, which is a (Continued)

(51) Int. Cl.
*H01L 31/18* (2006.01)
*H01L 31/0224* (2006.01)
(Continued)

(52) U.S. Cl.
CPC ...... *H01L 31/1896* (2013.01); *H01L 27/1266* (2013.01); *H01L 31/02168* (2013.01);
(Continued)

(58) Field of Classification Search
CPC ................... H01L 31/1896; H01L 27/1266
See application file for complete search history.

(56) References Cited

U.S. PATENT DOCUMENTS 4,663,829 A 5/1987 Hartman et al.
5,448,817 A 9/1995 Waldsmith
(Continued)

FOREIGN PATENT DOCUMENTS

JP 04116928 4/1992
JP 10190032 7/1998
(Continued)

OTHER PUBLICATIONS

List of IBM Patents or Patent Applications Treated as Related dated Dec. 3, 2019, 2 pages.

*Primary Examiner* — Robert A Vetere
(74) *Attorney, Agent, or Firm* — Tutunjian & Bitetto, P.C.; Erik Johnson

(57) ABSTRACT

A photovoltaic device includes an absorber layer having a back contact formed on the absorber layer, the back contact having an exposed surface free from a substrate. It further includes a top contact formed in contact with a transparent conductive layer opposite the back contact and a stressor layer forming a superstrate on the absorber layer opposite the back contact.

20 Claims, 7 Drawing Sheets

Related U.S. Application Data division of application No. 14/596,830, filed on Jan. 14, 2015, now Pat. No. 9,799,792.

(51) Int. Cl.
  *H01L 31/0216* (2014.01)
  *H01L 31/0445* (2014.01)
  *H01L 27/12* (2006.01)
  *H01L 33/00* (2010.01)

(52) U.S. Cl.
  CPC .......... *H01L 31/022425* (2013.01); *H01L 31/022441* (2013.01); *H01L 31/022475* (2013.01); *H01L 31/0445* (2014.12); *H01L 31/1864* (2013.01); *H01L 33/0093* (2020.05); *Y02E 10/50* (2013.01); *Y02P 70/50* (2015.11)

(56) References Cited

U.S. PATENT DOCUMENTS

| | | |
|---|---|---|
| 6,682,990 B1 | 1/2004 | Iwane et al. |
| 8,247,261 B2 | 8/2012 | Bedell et al. |
| 2010/0294346 A1* | 11/2010 | Frolov ............... C23C 14/0623 |
| | | 136/252 |
| 2012/0282782 A1 | 11/2012 | Bedell et al. |
| 2015/0069420 A1* | 3/2015 | Paranjpe ............ H01L 33/0093 |
| | | 257/79 |

FOREIGN PATENT DOCUMENTS

| | | |
|---|---|---|
| JP | 2004103625 | 4/2004 |
| KR | 19980033377 | 7/1998 |
| WO | 2007019487 | 2/2007 |

* cited by examiner

SUBSTRATE-FREE THIN-FILM FLEXIBLE PHOTOVOLTAIC DEVICE AND FABRICATION METHOD

BACKGROUND

Technical Field

The present invention relates to photovoltaic devices, and more particularly to thin films fabricated to be substrate-free or to include a super substrate (or superstrate) for photovoltaic devices or other devices by employing exfoliation processes.

Description of the Related Art

With growing concern about low-cost clean energy, solar power has become a focal point for alternatives to fossil fuel energy production. Solar cells employ photovoltaic properties to generate electrical current. Photons in sunlight hit a solar cell or panel and are absorbed by semiconducting materials, such as silicon. The photons produce electrons and holes that are separated by a solar cell's p-n junction and produce electrical current.

Solar energy, while clean and sustainable, typically relies on expensive technologies and materials for its implementation. These technologies include various advanced semiconductor growth, processing, device fabrication and characterization processes. Thin film solar cell technology offers a cost advantage due to its high performance and very thin absorber material requirement. However, these films are typically built on glass substrates to withstand harsh processing conditions such as high temperature or exposure to various chemicals.

SUMMARY

A photovoltaic device includes an absorber layer having a back contact formed on the absorber layer, the back contact having an exposed surface free from a substrate. It further includes a top contact formed in contact with a transparent conductive layer opposite the back contact and a stressor layer forming a superstrate on the absorber layer opposite the back contact.

Another embodiment of a photovoltaic device includes an absorber layer having a back contact formed on the absorber layer with the back contact having an exposed surface free from a substrate. It also includes a top contact formed in contact with a portion of the transparent conductive layer opposite the back contact and a stressor layer formed over a portion of the transparent conductive layer, where the stressor layer forms a superstrate.

These and other features and advantages will become apparent from the following detailed description of illustrative embodiments thereof, which is to be read in connection with the accompanying drawings.

BRIEF DESCRIPTION OF DRAWINGS

The disclosure will provide details in the following description of preferred embodiments with reference to the following figures wherein.

DETAILED DESCRIPTION OF PREFERRED EMBODIMENTS

Figure 1:
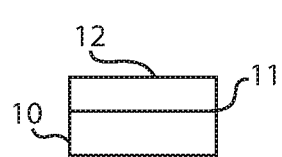
FIG. 1 is a cross-sectional view of a sample or structure having a target layer formed on a substrate or a device having a substrate in accordance with the present principles.

In accordance with the present principles, methods for exfoliating a thin film from a substrate using a stressor layer attached or deposited on the thin film are described. The underlying thin film can be exfoliated with high quality, by cooling down (or heating up) a thin film sample to a threshold temperature (which may also be referred to as a critical temperature) to create a stress due to thermal mismatch. The exfoliation occurs at a layer with a weakest interlayer bond. The low temperature process is also amenable for most thin film device fabrication processes. The stressor layer may serve as a secondary substrate to support the device, or can also serve additional functions such as encapsulation, insulation, antireflective coating, etc.

In one embodiment, a thermal exfoliation process is employed where a stressor layer is deposited on a thin film device. The stressor layer has a defined thickness configured for the exfoliation process to occur (e.g., for an acrylic adhesive tape, the thickness may be about 100 microns to generate sufficient stress). Upon cooling to a certain temperature, a thermal expansion mismatch will result in the exfoliation process that separates the device from its underlying substrate. In some embodiments, a substrate-less or standalone thin film solar cell may be provided. In other embodiments, methods for producing a superstrate thin film device (e.g., solar cell) are provided, which include employing the exfoliation technique to remove the original substrate.

It is to be understood that the present invention will be described in terms of a given illustrative architecture having substrate-less layers, photovoltaic stacks, etc.; however, other architectures, structures, substrates, materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A design for a sample, thin film and/or photovoltaic device may be created for standalone operation, integrated circuit integration or may be combined with components on a printed circuit board or other device. The circuit/board may be embodied in a graphical computer programming language, and stored in a computer storage medium (such as a disk, tape, physical hard drive, or virtual hard drive such as in a storage access network). If the designer does not fabricate chips or the photolithographic masks used to fabricate chips or photovoltaic devices, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of samples, thin films, photovoltaic devices and/or integrated circuit chips with or without photovoltaic devices. The resulting devices/chips can be distributed by the fabricator in raw wafer form (that is, as a single wafer that has multiple unpackaged devices/chips), as a bare die, or in a packaged form. In the latter case, the device/chip is mounted in a single chip package (such as a plastic carrier, with leads that are affixed to a motherboard or other higher level carrier) or in a multichip package (such as a ceramic carrier that has either or both surface interconnections or buried interconnections). In any case, the devices/chips are then integrated with other chips, discrete circuit elements, and/or other signal processing devices as part of either (a) an intermediate product, such as a motherboard, or (b) an end product. The end product can be any product that includes integrated circuit chips, ranging from toys, energy collectors, solar devices and other applications including computer products or devices having a display, a keyboard or other input device, and a central processor. The photovoltaic devices described herein are particularly useful for solar cells or panels employed to provide power to electronic devices, homes, buildings, vehicles, etc.

It should also be understood that material compounds will be described in terms of listed elements, e.g., MoS, MoSe or CdS. These compounds include different proportions of the elements within the compound, e.g., MoS includes $Mo_xS_{1-x}$, where x is less than or equal to 1, etc. In addition, other elements may be included in the compound, such as, e.g., $Mo(S, Se)_2$, and still function in accordance with the present principles. The compounds with additional elements will be referred to herein as alloys.

The present embodiments may be part of a photovoltaic device or circuit, and the circuits as described herein may be part of a design for an integrated circuit chip, a solar cell, a light sensitive device, etc. The photovoltaic device may be a large scale device on the order of feet or meters in length and/or width, or may be a small scale device for use in calculators, solar powered lights, etc.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a thin film sample or device is referred to as a target device, film or layer 12, which is fabricated on a substrate 10. The substrate may include glass, polymers, molybdenum-coated glass, silicon or other semiconductor material, metal or metal foil, plastic, or any other suitable material. The target layer 12 may include a single layer or plurality of layers. The target layer 12 may include a thin-film transistor, light-emitting device, phase change memory device, a solar cell, a plurality of tandem solar cells, active matrix or passive matrix display layers with or without thin film transistors, memory device layers, etc. Other thin film devices can be envisioned by those skilled in the art.

In particularly useful embodiments, a relatively weak bonding layer 11 should be provided between the target layer 12 and the substrate 10. The weak bonding layer 11 may be between the target layer 12 and the substrate 10 or may be between layers in the target layer 12. Relatively weak means that the bonding between the bonding layer 11 and a portion of the target layer 12 (e.g., a functional film of interest) is weaker than the bonding between other layers or the remaining portions of the target layer 12 and substrate 10 that are to be kept intact. The bonding layer 11 may include a deposited material or occur as a natural interface between the target layer 12 and the substrate 10 (or as an interface between layers of the target layer 12).

Figure 2:
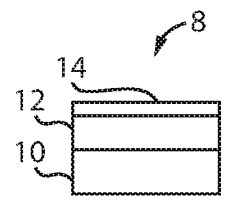
FIG. 2 is a cross-sectional view of the sample or structure of FIG. 1 having a stressor layer applied to the target layer in accordance with the present principles.

Referring to FIG. 2, a stressor layer 14 is applied to the target layer 12. The stressor layer 14 is configured to apply an exfoliating stress against the target layer 12 under certain conditions. The stressor layer 14 may include a pre-stress upon its formation on the target layer 12 or may be stress-free until the certain conditions are applied. The stressor layer 14 may include a metal, an inorganic layer or an adhesive film or tape. In one embodiment, the stressor layer 14 may include one or more layers of: nickel, titanium, chromium, tungsten, iron or alloys thereof. In another embodiment, the stressor layer 14 may include SiGe. In another embodiment, when a polymer is employed as the stressor layer 14, the stressor layer 14 may include acrylic, polyimides polyesters, polyolefins, polyacrylates, polyurethane, polyvinyl acetate, polyvinyl chloride or other suitable materials.

The material type, thickness and application parameters are determined for the stressor layer 14 to induce stress at the boundary layer 11 to cause exfoliation as will be described. The stressor layer 14 may be non-sacrificial and left intact to avoid extra cleaning steps that could be damaging to the device. The stressor layer 14 may also serve additional functions such as, e.g., form a secondary substrate, provide encapsulation, provide electrical insulation, form an anti-reflective coating, etc.

Figure 3:
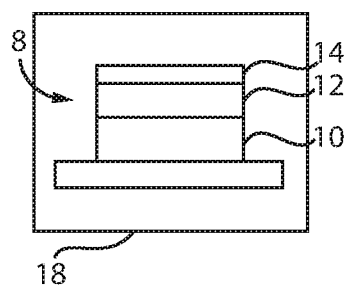
FIG. 3 is a cross-sectional view of the sample or structure of FIG. 2 being placed in a temperature controlled environment or chamber in accordance with the present principles.

Referring to FIG. 3, a device 8 is placed in a temperature controlled environment 18 to induce differential thermal expansion in the target 12 and stressor layer(s) 14. The temperature controlled environment 18 can be achieved using a cryostat (e.g., LN$_2$ vacuum cryostat), a hot plate, a refrigerator, a DISPLEX™ system, an oven, rapid thermal processing tool, etc. A threshold or critical temperature may be between about −200 degrees C. to about 400 degrees C. In other embodiments, the critical temperature may be between about −100 degrees C. to 200 degrees C. and more specifically between about −90 degrees C. to about 0 degrees C. The critical temperature depends on the materials and properties of the stressor layer 14, the target layer 12, the boundary layer 11 and/or the substrate 10. The temperature controlled environment 18 may include cooling or heating at a well-defined rate in a chamber to achieve the critical temperature.

Figure 4:
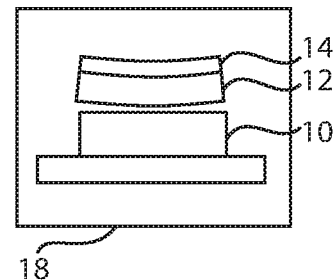
FIG. 4 is a cross-sectional view of the sample or structure of FIG. 3 after the target layer has been exfoliated at a critical temperature in accordance with the present principles.

Referring to FIG. 4, the temperature is controlled in the environment 18 to reach a critical temperature ($T_{critical}$) at which the exfoliation occurs. The temperature is preferably reduced to cool the device 8 to the critical temperature. The temperature may be adjusted at a fixed rate that may be linear with respect to time, although other relationships between temperature and time may be employed (e.g., exponential, multiple linear rates, etc.). Upon reaching the critical temperature, thermal exfoliation occurs such that the target layer 12 becomes separated from the substrate 10.

In one embodiment, the thermal exfoliation process employs a suitable stressor layer of a certain thickness and type (e.g., acrylic adhesive between 90-120 microns, and preferably about 110 microns). The thermal exfoliation process may include a cooling process to reach a certain low critical temperature (e.g., 200 K). The weak interlayer (11) associated with the target layers or device may include, e.g., a Mo—absorber interface that includes a Mo(S,Se)$_2$ layer, for example.

Figure 5:
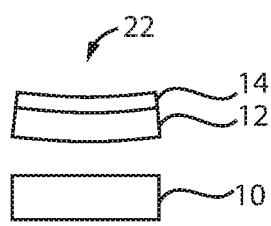
FIG. 5 is a cross-sectional view of the sample or structure of FIG. 4 after the target layer and the substrate have been separated in accordance with the present principles.

Referring to FIG. 5, the target device or layer 12 is completely detached from the substrate 10. The substrate 10 can be reused since it remains intact. The target device or layer 12 may be placed on another device or employed as a standalone device. The stressor layer 14 may optionally be removed, e.g., by etching or other process. The stressor layer 14 may remain as part of the structure and may provide secondary functions.

In one particularly useful embodiment, a flexible and light-weight solar cell device can be prepared using the thermal exfoliation process in accordance with the present principles. As an example, a chalcogenide thin film solar cell, e.g., CuInGaSSe (CIGS) and/or CuZnSnSSe (CZTS) may be employed and is described herein to demonstrate the present principles.

Figure 6:
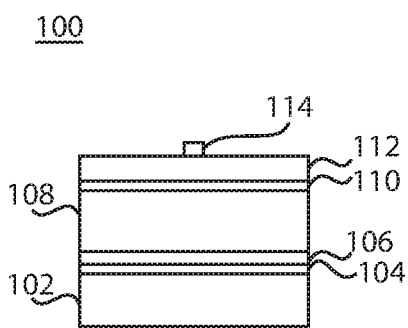
FIG. 6 is a cross-sectional view of a photovoltaic device (solar cell) provided as a base structure in accordance with the present principles.

Referring to FIG. 6, a photovoltaic device (e.g., solar cell) 100 is processed to exfoliate its operational structure (e.g., photovoltaic device structure) to form a substrate-free (substrateless) device in accordance with the present principles. The device 100 may include any photovoltaic structure or conventional device. In one embodiment, the device 100 includes a glass substrate 102 coated in a metal 106, such as molybdenum (Mo), where Mo serves as back contact layer (106). After deposition of an absorber layer 108 (e.g., CIGS and/or CZTS), there exists a Mo(S,Se) interlayer 106 that has a relatively weak interlayer bonding with the absorber layer 108 (e.g., CIGS and/or CZTS). A buffer layer 110 and a transparent conductive oxide (TCO) 112 are formed on the absorber layer 108. A top contact 114 is formed and patterned on the TCO layer 112. The buffer layer 110 may include a mixture of materials that reduce the formation of a Schottky barrier between the absorber layer 108 and the TCO layer 112. The TCO layer 112 may include indium tin oxide, zinc oxide, or other transparent conductor. The top contact 114 may include a metal or other conductive material.

In accordance with the present principles, a full thin film solar cell device is fabricated and preferably includes a Mo-coated glass substrate, although other materials may be employed that provide a weak bonded interface with the substrate 102. It should be understood that other photovoltaic device structures and materials may also be employed.

Figure 7:
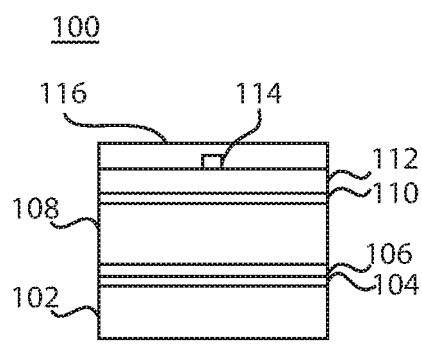
FIG. 7 is a cross-sectional view of the device of FIG. 6 having a stressor layer applied to the device in accordance with the present principles.

Referring to FIG. 7, a stressor layer 116 is applied over the top contact 114 and the TCO layer 112. The stressor layer 116 preferably includes a transparent material and/or may be employed as an antireflection (AR) coating. For example, a thin adhesive film may be applied that serves as an AR coating layer. The stressor layer 116 may include an acrylic material.

Figure 8:
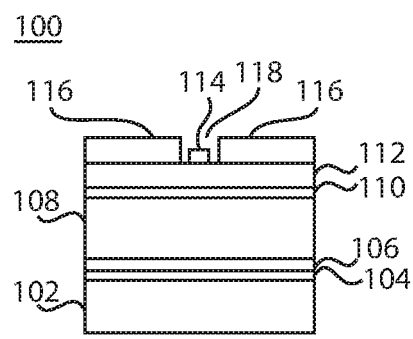
FIG. 8 is a cross-sectional view of the device of FIG. 7 showing the stressor layer patterned or opened up in accordance with the present principles.

Referring to FIG. 8, an opening 118 may optionally be formed in the stressor layer 116 to enable contacting the top contact 114. The opening process may include, e.g., patterned etching or laser ablation.

Figure 9:
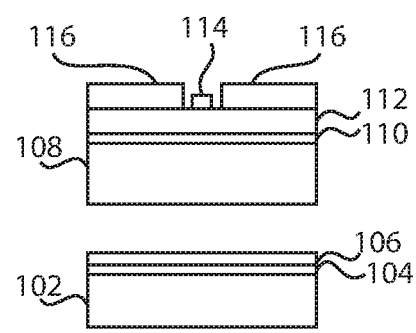
FIG. 9 is a cross-sectional view of the device of FIG. 8 showing a substrate removed from the device by a thermal exfoliation process in accordance with the present principles.

Referring to FIG. 9, a thermal exfoliation process is performed on the cell 100. The exfoliation process separates the absorber layer 108 (and its top layers 110, 112, 114, 116) from the underlying layers 106, 104, 102. The exfoliation process includes placing the cell 100 in a temperature controlled environment to induce differential thermal expansion/contraction between the absorber layer 108 and the Mo(S,Se)$_2$ layer 106. The temperature controlled environment can be achieved using a cryostat, a hot plate, a refrigerator, a DISPLEX™ system, an oven, rapid thermal processing tool, etc. A threshold or critical temperature depends on the materials and properties of the stressor layer 116, the absorber layer 108 and/or the substrate 102.

As a result of achieving the temperature threshold, the substrate 102 is separated from the absorber layer 108. The substrate 102 may be reused.

Figure 10:
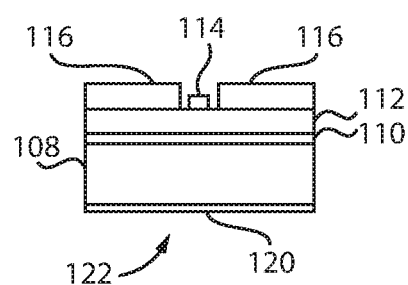
FIG. 10 is a cross-sectional view of the device of FIG. 9 after a back contact is formed in accordance with the present principles.

Referring to FIG. 10, a new back contact metal 120 is deposited to complete a substrate free photovoltaic device 122. The back contact metal 120 may include, e.g., Al, Ag, Cr or other metals or transparent conductive materials. The stressor layer 116 may be removed or may remain on the device 122 to serve as a secondary substrate. The stressor layer 116 may provide additional functions, such as encapsulation, insulation, anti-reflective coating, etc. Examples of suitable stressor layers may include materials such as, e.g., acrylic, polymide or other transparent films coated with adhesive on one side.

A standalone thin film photovoltaic device (solar cell) 122 may be produced in accordance with the present principles. Standalone here refers to the photovoltaic device free from its original substrate (also referred to as substrate-free). The device 122 can be further processed to be attached to another device or support structure. In one embodiment, the device 122 can be supported by the stressor layer 116. Since the stressor layer 116 is thin, this standalone device 122 can serve as a flexible and ultra-lightweight solar cell device.

Referring to FIGS. 11-16, an alternative device fabrication scheme is shown in accordance with another embodiment. FIGS. 11-16 form a photovoltaic device 150 (FIG. 16) with a superstrate where a top metal contact is deposited beyond a device area, so both contact terminals can be accessed from a back surface of the device. The superstrate is formed using a stressor layer or other layer to function as a post formed substrate-like layer while the original substrate is removed from the opposite side by an exfoliation process. The superstrate device includes a top contact 158 that can be deposited through or beyond the device area so that both device contacts are accessible from a back of the device (while light is coming from the top). One advantage is that no opening (118) is needed in the stressor layer 116.

Figure 11:
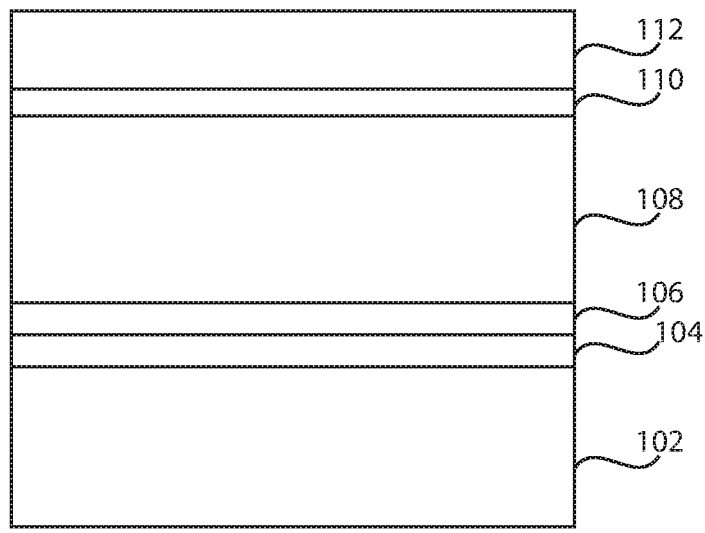
FIG. 11 is a cross-sectional view of a photovoltaic device structure before forming a top contact in accordance with the present principles.

Referring to FIG. 11, the structure described with respect to FIG. 6 is illustratively employed to demonstrate an alternative process. The structure of FIG. 11 does not include a top contact 114 as employed in FIG. 6. The structure of FIG. 11 may include any photovoltaic structure or conventional device.

Figure 12:
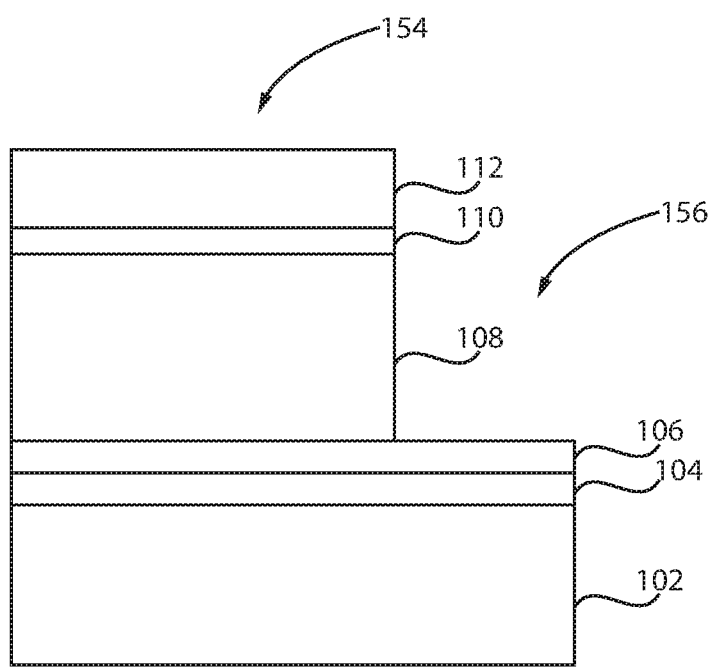
FIG. 12 is a cross-sectional view of the device of FIG. 11 after etching or showing an end portion of the photovoltaic device structure with an interface layer exposed in accordance with the present principles.

Referring to FIG. 12, openings 156 may be etched or otherwise formed through layers 112, 110 and 108 to expose layer 106 (or layer 104). Openings or recesses 156 may be created as part of the fabrication process for forming a structure 154. For example, openings 156 can be provided at an edge or end portion of structure 154 or the structure 154 may be formed by etching regions to expose the weak bonding layer (the interface between layers 106 and 108) where an exfoliation layer break is to occur.

Figure 13:
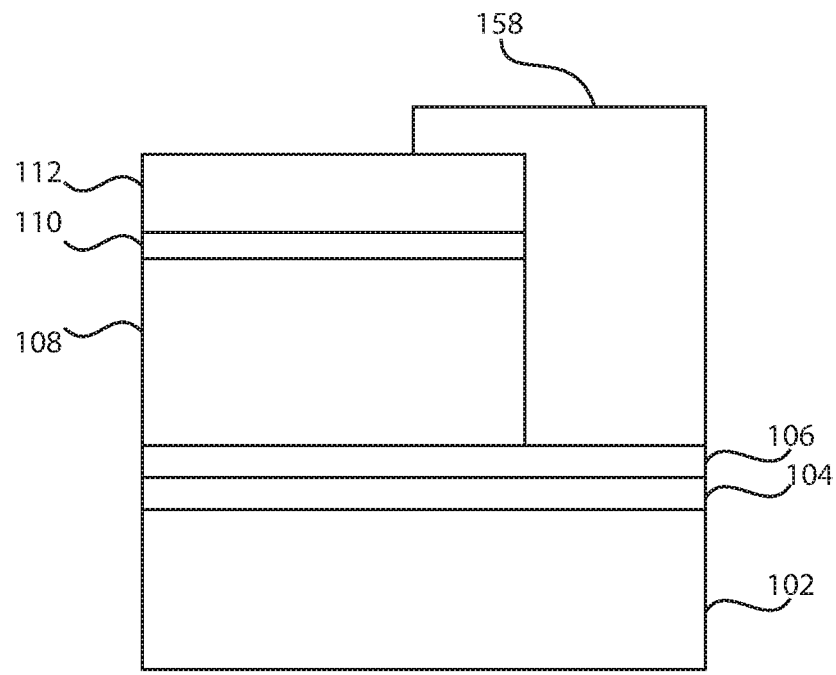
FIG. 13 is a cross-sectional view of the device of FIG. 12 after forming a top contact that extends to a back surface of the photovoltaic device structure in accordance with the present principles.

Referring to FIG. 13, a top contact metal 158 is formed in the openings 156 and formed to cover only a portion of the TCO layer 112. The top contact metal 158 may be selectively formed or blanket deposited and etched back. The formation processes may include physical vapor deposition, sputtering, chemical vapor deposition, etc. The materials of top contact 158 may include a metal (e.g., the materials on top contact 114), transparent oxide, or any other suitable conductor.

Figure 14:
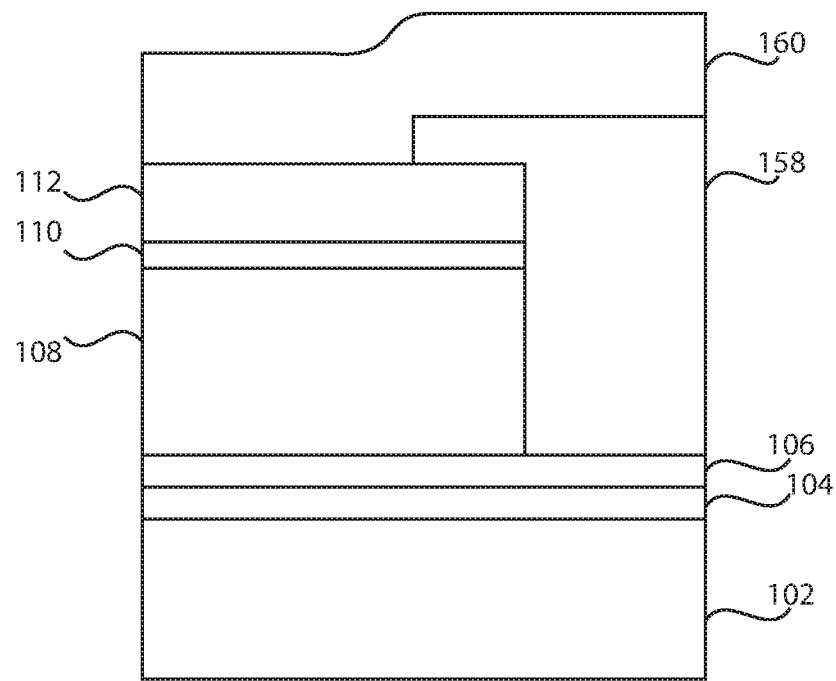
FIG. 14 is a cross-sectional view of the device of FIG. 13 after forming a stressor layer over the top contact (and possible other layers) in accordance with the present principles.

Referring to FIG. 14, a stressor layer 160 is applied over the top contact 158 and the TCO layer 112. The stressor layer 160 preferably includes a transparent material. The stressor layer 160 may include an acrylic material and may be employed as an antireflection (AR) coating, insulation layer, encapsulation layer, etc. The stressor layer 160 preferably forms a permanent part of the device and forms a superstrate to provide support for the device, as will be described.

Figure 15:
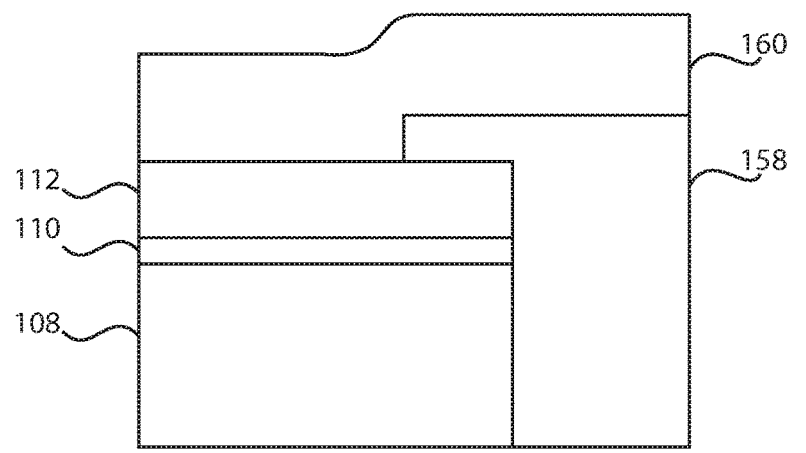
FIG. 15 is a cross-sectional view of the device of FIG. 14 showing a substrate removed from the device by a thermal exfoliation process in accordance with the present principles.
Figure 15:
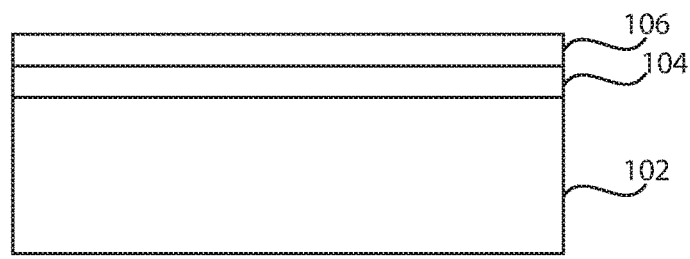

Referring to FIG. 15, a thermal exfoliation process is performed on the device. The exfoliation process separates the absorber layer 108 (and its top layers 110, 112, 158, 160) from the underlying layers 106, 104, 102. The exfoliation process includes placing the device in a temperature controlled environment to induce differential thermal expansion/contraction between the absorber layer 108 and the layer 106. The temperature controlled environment can be achieved using a cryostat, a hot plate, a refrigerator, a DISPLEX™ system, an oven, rapid thermal processing tool, etc. A threshold or critical temperature depends on the materials and properties of the stressor layer 160, the absorber layer 108 and/or the substrate 102.

As a result of achieving the temperature threshold, the substrate 102 is separated from the absorber layer 108. The substrate 102 may be reused.

Figure 16:
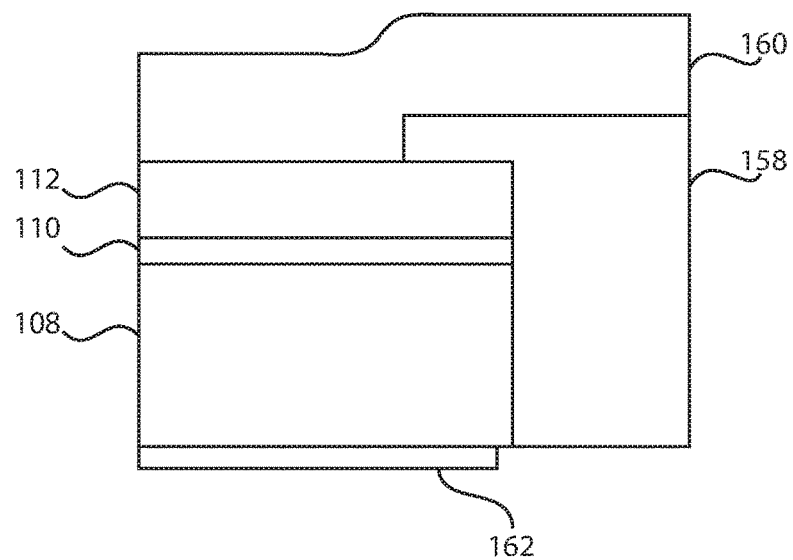
FIG. 16 is a cross-sectional view of the device of FIG. 15 after a back contact is formed with the stressor layer forming a superstrate and where the top contact is deposited beyond or through a device area, so that both contact terminals can be accessed from the back surface in accordance with the present principles.

Referring to FIG. 16, a new back contact metal 162 is deposited to complete a superstrate photovoltaic device 150, which is free of its original substrate (102). The back contact metal 162 may include, e.g., Al, Ag, Cr or other metals or transparent conductive materials. The back contact metal 162 does not contact the top contact 158. The stressor layer 160 remains on the device 150 to provide support and may serve one or more secondary functions, such as, e.g., encapsulation, insulation, anti-reflective coating, etc. Examples of suitable stressor layers may include materials such as, e.g., acrylic, polyimide or other transparent films coated with adhesive on one side.

The standalone thin film photovoltaic device (solar cell) 150 can be further processed to be attached to another device or support structure. In one embodiment, the device 150 can be supported by the stressor layer 160. Since the stressor layer 160 is thin, this standalone device 150 can serve as a flexible and ultra-lightweight solar cell device. In addition, both contacts 162 and 158 can be accessed from a back side of the device 150 (e.g., on an opposite side from a light receiving side (i.e., through layer 160).

In one experiment conducted by the inventors, the exfoliation process in accordance with the present principles, was conducted for a CZTS thin film solar cell grown on Mo coated glass substrate. A clean, standalone CZTS solar cell device can be exfoliated away from its substrate. The exfoliation process left behind smooth surfaces on both the exfoliated film and the left-behind glass substrate. The smooth surface on the exfoliated film permitted metal contact deposition. The cleaned substrate can be reused for a repeat device fabrication.

In the experiment conducted, the exfoliation process occurs at critical temperature around 200 K. This information is obtained by monitoring the solar cell efficiency as the device is cooled down in a liquid nitrogen flow cryostat.

Figure 17:
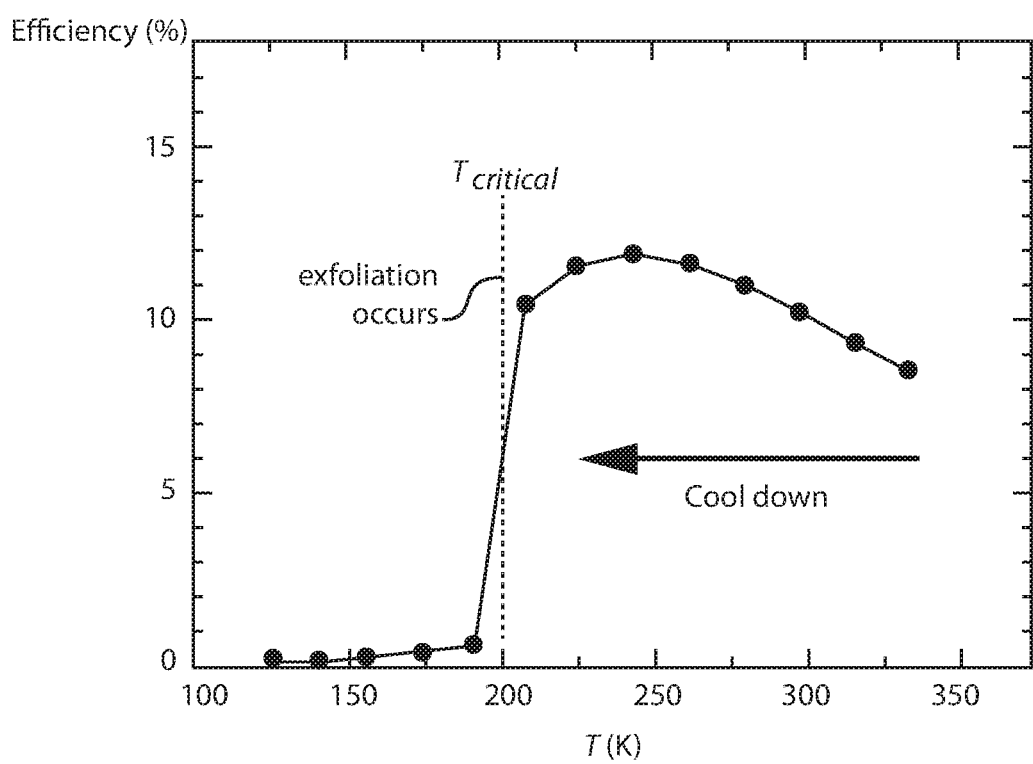
FIG. 17 is a graph showing an efficiency profile (%) versus temperature (K) to determine a critical temperature during an exfoliation process for a thin film solar cell device by monitoring performance/temperature in accordance with the present principles.

Referring to FIG. 17, an exfoliation process in a thin film solar cell device is monitored by measuring power conversion efficiency profile (%) versus temperature (K). At around the critical temperature of ~200K, the efficiency suddenly drops as the film exfoliates away from its Mo-coated substrate that would normally serve as the back contact.

Techniques to exfoliate or isolate thin film devices, such as transistors or solar cells, are of important interest both scientifically and technologically. Technologically, exfoliated thin film devices can be employed to fabricate ultrathin, substrateless and flexible devices; can be employed in applications where weight needs to be minimized (e.g., portable or autonomous electronics device), can be employed to transfer the device to a secondary substrate of choice, etc. This permits growth and fabrication on standard substrates to optimize the device performance and then have the device deployed on a final targeted secondary substrate. For example, a thin film solar cell can be grown on a glass substrate where optimum processing and high temperature can be applied and then the resulting device can be exfoliated and transferred to a cheaper or flexible substrate. Exfoliated thin film devices can be used to recycle the back substrate to minimize the cost.

Scientifically, exfoliated thin film devices are of interest to isolate the device from a back layer, e.g., a metal back contact, so certain characterizing electrical measurements can be conducted. For example, a thin film solar cell absorber layer, which is usually grown on metal (e.g., molybdenum), can be exfoliated away from the metal layer to allow electrical and Hall characterization to be performed to yield the charge type, carrier density and mobility of the majority carrier. Carrier density information is very pertinent for device optimization.

Exfoliated thin film devices are of interest to investigate the characteristics of the back surface of the device and to investigate alternative back contact layers such as different back contact metals. By exfoliating the device from the original back contact metal one can apply/test a different metal layer that may improve performance, e.g., due to more favorable band alignment or work function.

Figure 18:
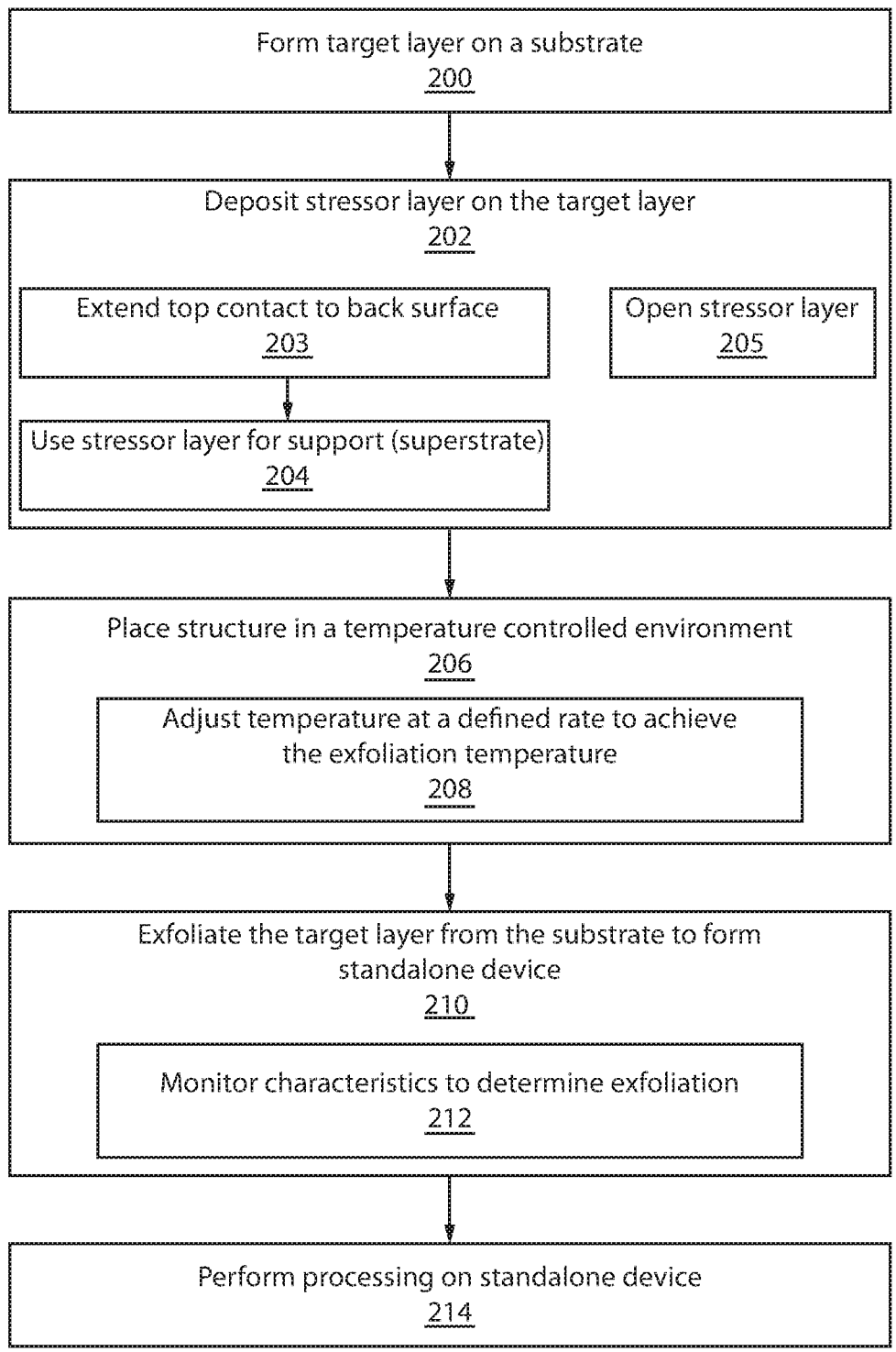
FIG. 18 is a block/flow diagram showing thermal exfoliation processes in accordance with illustrative embodiments.

Referring to FIG. 18, a method for thermal exfoliation is shown in accordance with illustrative embodiments. In block 200, a target layer is provided or formed on a substrate to form a structure. The target layer may include at least one of a thin-film transistor, light-emitting device, phase change memory device, a solar cell or any other electronic device or layer. The target layer or the interface between the target layer and the substrate is configured to provide a weak bonding layer (a separation layer) to permit separation when exfoliating the target layer. The weak bonding layer is designed to provide a separation between adjacent layers/structures. For example, the weak bonding layer may include a Mo containing interface layer with a Mo-coated substrate glass.

In block 202, a stressor layer is deposited on the target layer. The stressor layer may include one of a metal, an inorganic layer or an adhesive film. The stressor layer may include one of an anti-reflection coating, an encapsulation layer, an insulator or provide another secondary function.

In one embodiment, the stressor layer may be employed as a superstrate. In block 203, a top contact may be formed on the photovoltaic device structure that extends to a back surface of the photovoltaic device structure. The photovoltaic device structure is formed on the substrate at the back surface. The top contact may follow an end portion of the photovoltaic structure or openings may be formed in the photovoltaic structure to permit the top contact to extent to the back surface of the structure. In block 204, the stressor layer is formed over at least a portion of the top contact (and may be formed over the TCO layer (112) or other layers) to support the photovoltaic device structure as the superstrate.

In another embodiment, in block 205, the stressor layer may be opened to enable access to a top contact (e.g., in a solar cell) or other components, layers or materials. The opening may be provided through masked etching, laser ablation or other techniques.

In block 206, the structure is placed in a temperature controlled environment to induce differential thermal expansion in the structure and the stressor layer. This may include heating or cooling. In one embodiment, the structure is cooled cryogenically. In block 208, a temperature in the temperature controlled environment is adjusted at a defined rate to achieve the threshold or critical temperature, e.g., between about −200 degrees C. and about 400 degrees C.

In block 210, the target layer is exfoliated from the substrate when a critical temperature is achieved such that the target layer is separated from the substrate to produce a standalone, thin film device. In block 212, characteristics of the device (e.g., temperature and/or performance) may be monitored to determine when exfoliation has been achieved.

In block 214, additional processing may include attaching the standalone thin film device to another component or support structure, depositing a back contact (e.g., on a solar cell structure), forming a flexible thin film device, etc. The standalone, thin film device is preferably flexible and light weight and may be employed in a plurality of useful applications.

Having described preferred embodiments for substrate-free thin-film flexible photovoltaic device and fabrication method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A photovoltaic device, comprising:
an absorber layer having a back contact formed on the absorber layer, the back contact having an exposed surface free from a substrate;
a top contact formed in contact with a transparent conductive layer opposite the back contact; and
a stressor layer forming a superstrate on the absorber layer opposite the back contact.

2. The device as recited in claim 1, wherein the top contact extends to a back surface of the photovoltaic device.

3. The device as recited in claim 2, wherein the stressor layer includes an antireflection coating.

4. The device as recited in claim 2, wherein the stressor layer includes an insulation layer.

5. The device as recited in claim 2, wherein the stressor layer includes an encapsulation layer to encapsulate at least a portion of the device.

6. The device as recited in claim 2, wherein the stressor layer is formed over the top contact and is opened to expose the top contact.

7. The device as recited in claim 1, wherein the top contact extends perpendicularly to the absorber layer.

8. The device as recited claim 1, wherein the stressor layer includes a metal.

9. The device as recited claim 1, wherein the stressor layer includes an inorganic layer.

10. The device as recited claim 1, wherein the stressor layer includes an adhesive film.

11. A photovoltaic device, comprising:
an absorber layer having a back contact formed on the absorber layer, the back contact having an exposed surface free from a substrate;
a top contact formed in contact with a portion of the transparent conductive layer opposite the back contact; and
a stressor layer formed over a portion of the transparent conductive layer, wherein the stressor layer forms a superstrate.

12. The device as recited in claim 11, wherein the top contact extends to a back surface of the photovoltaic device.

13. The device as recited in claim 12, wherein the stressor layer includes an antireflection coating.

14. The device as recited in claim 12, wherein the stressor layer includes an insulation layer.

15. The device as recited in claim 12, wherein the stressor layer includes an encapsulation layer to encapsulate at least a portion of the device.

16. The device as recited in claim 12, wherein the stressor layer is formed over the top contact and is opened to expose the top contact.

17. The device as recited in claim 11, wherein the top contact extends perpendicularly to the absorber layer.

18. The device as recited claim 11, wherein the stressor layer includes a metal.

19. The device as recited claim 11, wherein the stressor layer includes an inorganic layer.

20. The device as recited claim 11, wherein the stressor layer includes an adhesive film.

* * * * *